(12) United States Patent
Seo et al.

(10) Patent No.: US 10,734,464 B2
(45) Date of Patent: Aug. 4, 2020

(54) VIRTUAL REALITY DISPLAY INCLUDING LIGHT DIFFUSION MEMBER CONFIGURED TO DIFFUSE LIGHT FROM LIGHT-TRANSMITTING AREAS TO LIGHT-BLOCKING AREAS

(71) Applicant: LG DISPLAY CO., LTD., Seoul (KR)

(72) Inventors: Woong-Jin Seo, Daegu (KR); Tae-Yong Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 263 days.

(21) Appl. No.: 15/445,261

(22) Filed: Feb. 28, 2017

(65) Prior Publication Data

US 2017/0263691 A1 Sep. 14, 2017

(30) Foreign Application Priority Data

Mar. 11, 2016 (KR) ........................ 10-2016-0029777

(51) Int. Cl.
*H01L 27/32* (2006.01)
*G02F 1/1335* (2006.01)
*H01L 51/52* (2006.01)

(52) U.S. Cl.
CPC .... *H01L 27/3272* (2013.01); *G02F 1/133504* (2013.01); *G02F 1/133512* (2013.01); *G02F 1/133514* (2013.01); *G02F 1/133526* (2013.01); *G02F 1/133528* (2013.01); *H01L 27/322* (2013.01); *H01L 27/3216* (2013.01); *H01L 27/3218* (2013.01); *H01L 27/3262* (2013.01); *H01L 51/5275* (2013.01)

(58) Field of Classification Search
CPC combination set(s) only.
See application file for complete search history.

(56) References Cited

U.S. PATENT DOCUMENTS

| 8,408,775 B1* | 4/2013 | Coleman | F21V 7/04 |
| | | | 362/602 |
| 2015/0084026 A1* | 3/2015 | Miyamoto | H01L 51/5275 |
| | | | 257/40 |
| 2016/0043145 A1* | 2/2016 | Choi | H01L 27/322 |
| | | | 257/40 |
| 2016/0218323 A1* | 7/2016 | Seo | H01L 51/5268 |
| 2019/0041658 A1* | 2/2019 | Gollier | G02B 27/1066 |

* cited by examiner

*Primary Examiner* — Matthew E. Gordon
(74) *Attorney, Agent, or Firm* — Birch, Stewart, Kolasch & Birch, LLP (57) ABSTRACT

A display for virtual reality is discussed, which is capable of alleviating a screen-door effect, thereby improving its image quality. In the display for virtual reality, a light diffusion member, which diffuses light emitted from a light-transmitting area of a display panel to a light-blocking area of the display panel, is interposed between the display panel and an optical lens, whereby a user who views an image displayed on the display panel at a very close position does not perceive the light-blocking area, which improves the image quality of the display.

19 Claims, 11 Drawing Sheets

VIRTUAL REALITY DISPLAY INCLUDING LIGHT DIFFUSION MEMBER CONFIGURED TO DIFFUSE LIGHT FROM LIGHT-TRANSMITTING AREAS TO LIGHT-BLOCKING AREAS

This application claims the priority benefit of Korean Patent Application No. 10-2016-0029777, filed on Mar. 11, 2016 in Republic of Korea, which is hereby incorporated by reference as if fully set forth herein.

BACKGROUND OF THE INVENTION

Field of the Invention

The present invention relates to a display for virtual reality, which may alleviate a screen-door effect, thereby improving the image quality of the display.

Discussion of the Related Art

A display for virtual reality is a visualization device that provides virtual reality (VR) or augmented reality by making a virtual image feel like reality through vivid images, sounds, and the like. Such a display for virtual reality realizes a large viewing area despite the small size thereof and has no limitation as to the viewing angle, and therefore, has been utilized in various fields including, for example, augmented-reality industry and education, virtual-reality experience appliances, wearable PC monitors, theme parks, movie viewing, and game display devices.

However, because a display for virtual reality according to the related art forms an image at a position that is very close to the user's eyes, a light-blocking area between the sub-pixels of a display panel is clearly visible. Therefore, there occurs a screen-door effect, in which a lattice resembling a mosquito net is visible in an image realized in the display for virtual reality according to the related art, which is undesirable.

SUMMARY OF THE INVENTION

Accordingly, the present invention is directed to a display for virtual reality that substantially obviates one or more problems due to limitations and disadvantages of the related art.

An object of the present invention is to provide a display for virtual reality, which may alleviate a screen-door effect, thereby improving image quality.

Additional advantages, objects, and features of the invention will be set forth in part in the description which follows and in part will become apparent to those having ordinary skill in the art upon examination of the following or may be learned from practice of the embodiments of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a display for virtual reality in which a light diffusion member, which diffuses light emitted from a light-transmitting area of a display panel to a light-blocking area of the display panel, is interposed between the display panel and an optical lens, whereby a user who views an image displayed on the display panel at a very close position does not perceive the light-blocking area, which may result in the improved image quality of the display panel.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, embodiments in accordance with the present invention will be described in detail with reference to the accompanying drawings.

Figure 1:
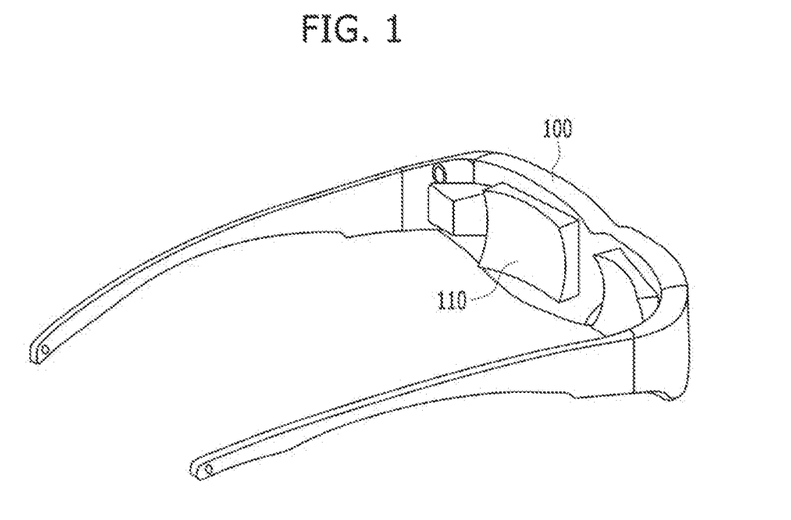
FIG. 1 is a perspective view illustrating a display for virtual reality according to an embodiment of the present invention.
Figure 2:
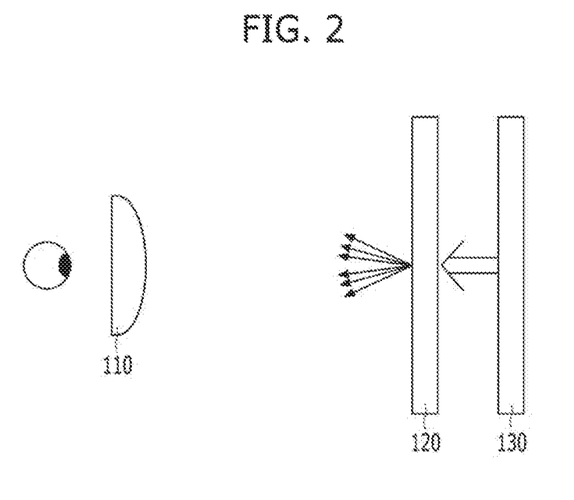
FIG. 2 is a cross-sectional view illustrating the display for virtual reality illustrated in FIG. 1.

FIG. 1 is a perspective view illustrating a display for virtual reality according to an embodiment of the present invention, and FIG. 2 is a cross-sectional view illustrating the display for virtual reality illustrated in FIG. 1. All the components of the display for virtual reality according to all embodiments of the present invention are operatively coupled and configured.

The display for virtual reality illustrated in FIGS. 1 and 2 includes a frame 100, an optical lens 110, a display panel 130, and a light diffusion member 120.

The frame 100 has a user-wearable shape, such as, for example, the shape of a pair of glasses or a helmet.

The optical lens 110 is disposed between the display panel 130 and a user to transfer an image, output from the display panel 130, to the user's eyes. The optical lens 110 enlarges the image, formed by the display panel 130, and refracts the enlarged image toward the user's eyeballs. Thus, the optical lens 110 serves to increase the viewing angle that the user can perceive, and to adjust the focal distance. Accordingly, the user may experience an effect in which the image formed by the display panel 130 looks like an image on a large screen at a certain distance.

Figure 3:
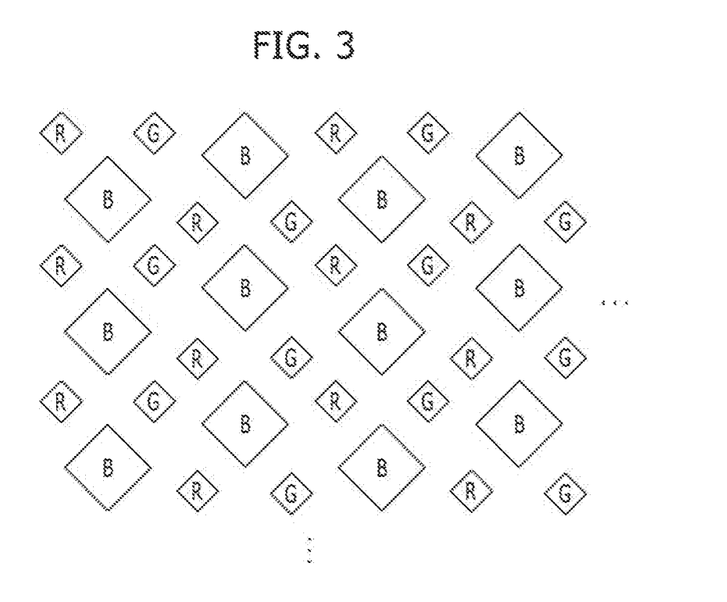
FIG. 3 is a plan view for explaining respective sub-pixels of a display panel illustrated in FIG. 2.

The display panel 130 includes a plurality of unit pixels, which are arranged in a matrix form. Each unit pixel may include red, green, and blue display sub-pixels R, G and B as illustrated in FIG. 3, or may include red, green, blue, and white sub-pixels R, G, B and W. Each sub-pixel is provided with a color filter or a light-emitting layer, which emits light of a predetermined color. A light-blocking area is disposed between the sub-pixels in order to prevent the mixing of color emitted from the color filter or the light-emitting layer. Note that the structure of the sub-pixels illustrated in FIG. 3 is merely given by way of example, and the present invention is not limited to the structure illustrated in FIG. 3.

The light diffusion member 120 is disposed between the display panel 130 and the optical lens 110. The light diffusion member 120 diffuses the light emitted from the respective sub-pixels of the display panel 130 to the light-blocking area between the sub-pixels, thereby minimizing the perception of the light-blocking area between the sub-pixels. To this end, the light diffusion member 120 appropriately adjusts the haze ratio depending on at least one variable selected from among the resolution of the display panel 130, the size of the display panel 130, the pixel density (e.g., pixels per inch (PPI)), and the distance from the upper surface of the color filter or the light-emitting layer to the upper surface of the light diffusion member 120. When the haze ratio is excessively low, the amount of light that is diffused to the light-blocking area is small and the user may perceive the light-blocking area. When the haze ratio is excessively high, the amount of light that is diffused to the light-blocking area is large, and an image is blurred.

Figure 4:
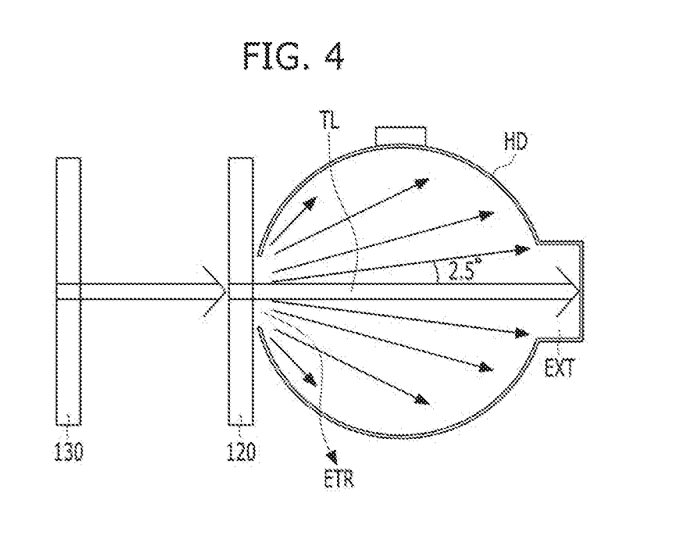
FIG. 4 is a cross-sectional view illustrating haze measurement equipment for measuring the haze ratio of a light diffusion member illustrated in FIG. 2.

Here, the haze ratio indicates the degree of diffusion of incident light, and is the ratio of refracted light to all of the transmitted light that has passed through the light diffusion member 120. This haze ratio is measured using a haze measurement device HD illustrated in FIG. 4. That is, light emitted from the display panel 130 passes through the light diffusion member 120 to thereby be introduced into the haze measurement device HD. At this time, the light that has passed through the light diffusion member 120 is subjected to, for example, refraction. The haze measurement device HD measures the light that proceeds within a predetermined angle (e.g., 2.5°) relative to a light incidence axis, by collecting the light at an exit. At this time, by measuring the amount Tt of the totality of light that has passed through the light diffusion member 120 at the entrance of the haze measurement device HD and the amount Td of light that has been refracted and has proceeded at a predetermined angle or more, calculation based on the haze ratio may be performed to obtain the value acquired by the following Equation 1.

$$\text{Haze}=Td/Tt \times 100\% \qquad \text{Equation 1}$$

As described, by appropriately adjusting the haze ratio via the light diffusion member 120, the light emitted from the respective sub-pixels of the display panel 130 may be diffused to the light-blocking area between the sub-pixels. Thereby, the user may perceive that the width of the light-blocking area between the sub-pixels is smaller than the perception limit width, and therefore the user may perceive an increased aperture ratio.

Here, the perception limit width of the user is the perception limit width RW of the light-blocking area between the sub-pixels, as perceived by the user who views the display for virtual reality, and may be calculated via the following Equation 2.

$$\text{FOV}:PW=\text{Resolution of Eyes}:RW \qquad \text{Equation 2}$$

As illustrated in Equation 2, the ratio of the maximum field of view (FOV) that the user can perceive to the maximum width PW of the display panel 130 is the same as the ratio of the minimum FOV that the user can perceive, i.e. the angular resolution of the eyes to the perception limit width RW. For example, when the user perceivable FOV of the display for virtual reality is 100°, the maximum width PW of the 5.5-inch display panel is 60.9 mm, and the angular resolution of the eyes is $1/60°$, the perception limit width RW is 10.1 μm.

Figure 5A:
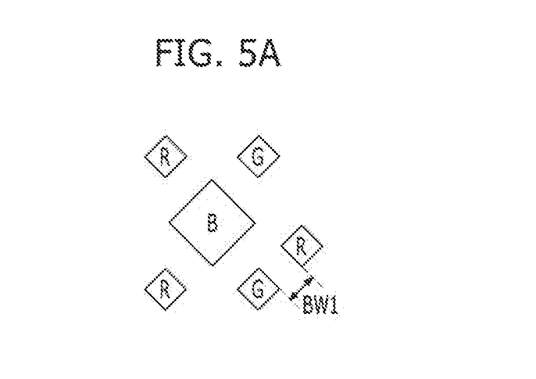
FIG. 5A is a view illustrating the sizes of the respective sub-pixels of the display panel illustrated in FIG. 2.
Figure 5B:
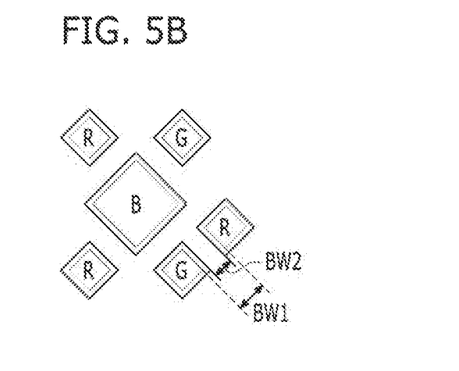
FIG. 5B is a view illustrating the sizes of enlarged sub-pixels, which are perceived by a user owing to the light diffusion member illustrated in FIG. 2.

Accordingly, when the width BW1 of the light-blocking area between the sub-pixels of the display for virtual reality illustrated in FIG. 5A is equal to or larger than the perception limit width, the light emitted from the respective sub-pixels of the display panel may be diffused to the light-blocking area between the sub-pixels by appropriately adjusting the haze ratio using the light diffusion member 120. In this way, as illustrated in FIG. 5B, because the user perceives the sub-pixels as being enlarged, and the width BW2 of the light-blocking area that the user perceives is smaller than the perception limit width of the user, the user may perceive an increased aperture ratio.

The light diffusion member 120 has a film shape having any one of the structures illustrated in FIGS. 6A to 9C.

Figure 6A:
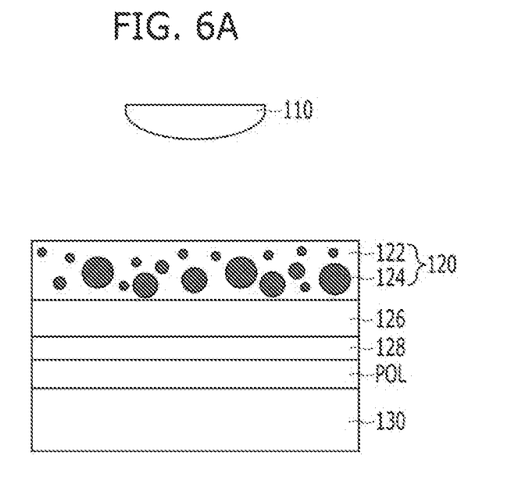
FIGS. 6A to 6C are cross-sectional views illustrating a first embodiment of the light diffusion member illustrated in FIG. 2 according to the present invention.
Figure 6B:
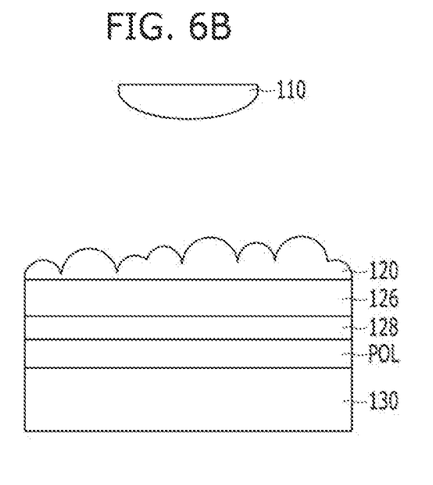
Figure 6C:
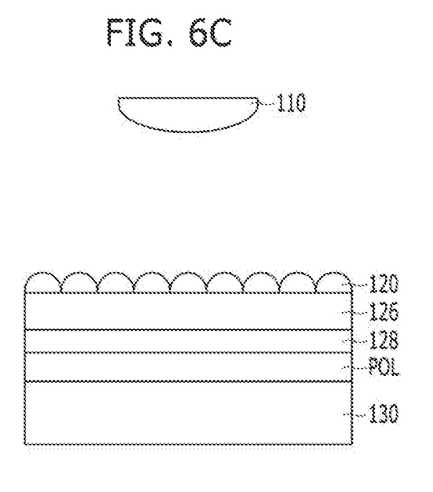

The light diffusion member 120 illustrated in FIGS. 6A to 6C is formed on a base film 126, and is disposed on the display panel 130 or a polarizer POL with an adhesive layer 128.

Figure 7A:
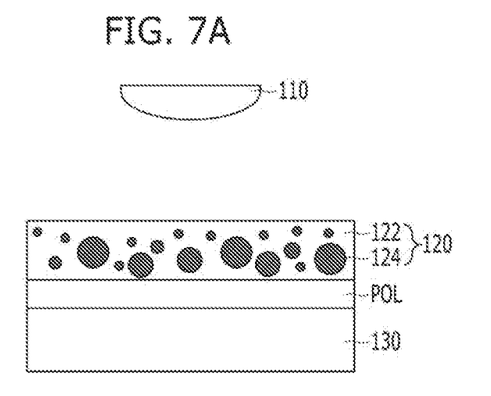
FIGS. 7A to 7C are cross-sectional views illustrating a second embodiment of the light diffusion member illustrated in FIG. 2 according to the present invention.
Figure 7B:
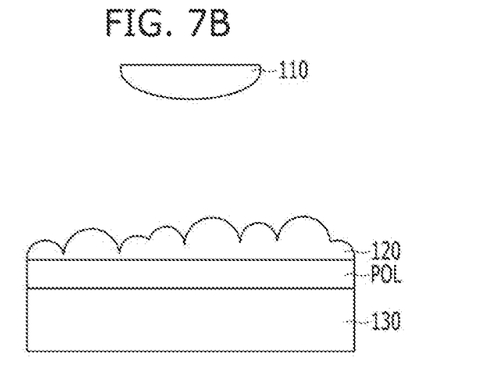
Figure 7C:
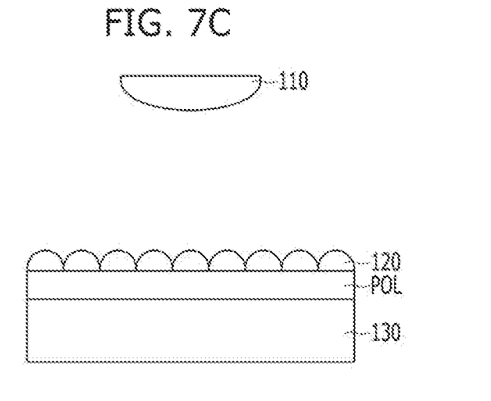

Further, the light diffusion member 120 illustrated in FIGS. 7A to 7C is disposed on the polarizer POL of the display panel 130 to be integrated with the polarizer POL. The light diffusion member 120 illustrated in FIGS. 7A to 7C does not require, for example, the base film 126 or the adhesive layer 128, unlike the structure illustrated in FIGS. 6A to 6C, thus realizing a reduction in the thickness and weight thereof.

Figure 8A:
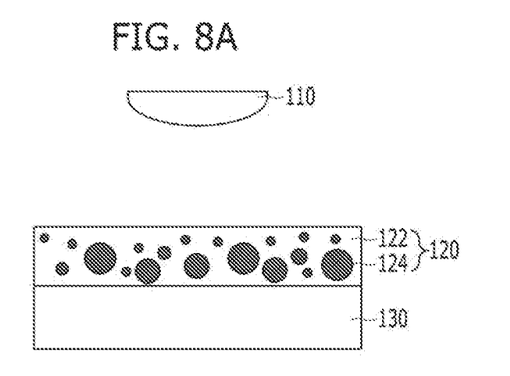
FIGS. 8A to 8C are cross-sectional views illustrating a third embodiment of the light diffusion member illustrated in FIG. 2 according to the present invention.
Figure 8B:
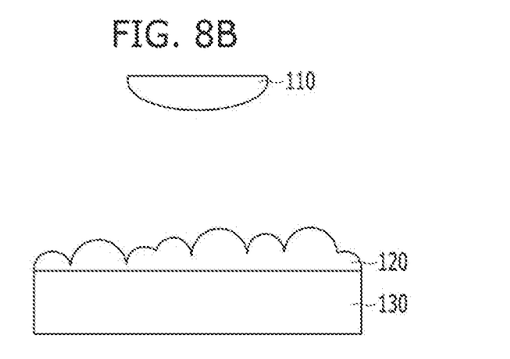
Figure 8C:
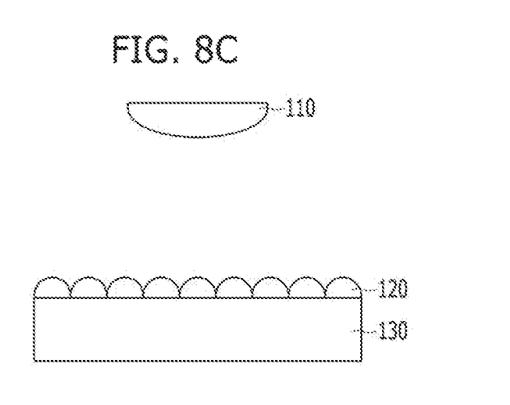

Furthermore, the light diffusion member 120 illustrated in FIGS. 8A to 8C is disposed on the uppermost layer of the display panel 130, for example, on an upper substrate of the display panel or an encapsulation layer of an organic light-emitting diode display panel. Thus, the light diffusion member 120 illustrated in FIGS. 8A to 8C does not require, for example, the base film 126 or the adhesive layer 128, unlike the structure illustrated in FIGS. 6A to 6C, thus realizing a reduction in the thickness and weight thereof.

Figure 9A:
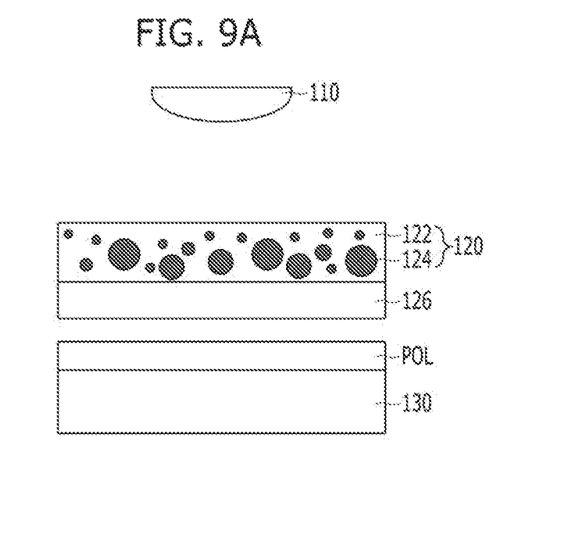
FIGS. 9A to 9C are cross-sectional views illustrating a fourth embodiment of the light diffusion member illustrated in FIG. 2 according to the present invention.
Figure 9B:
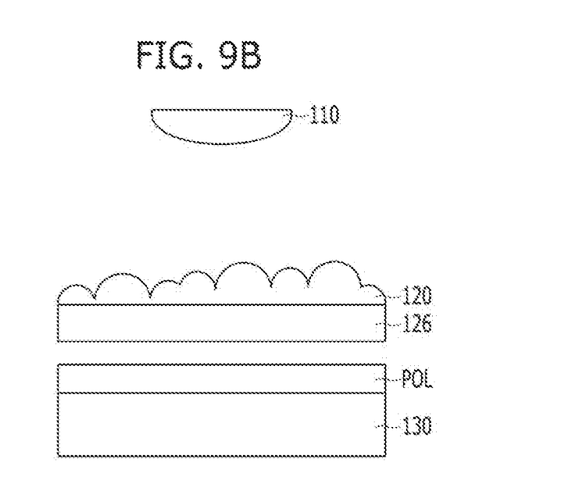
Figure 9C:
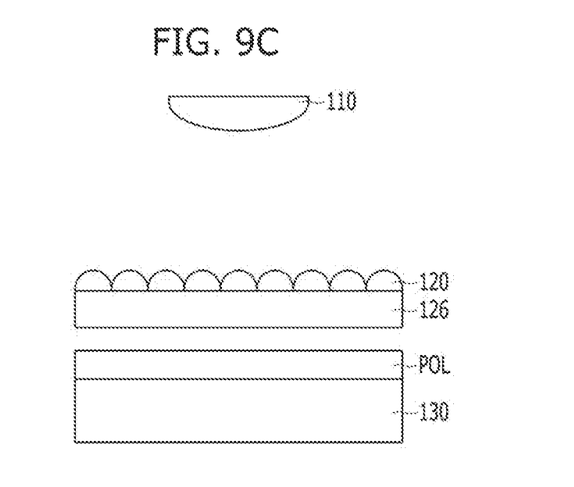

The light diffusion member 120 illustrated in FIGS. 9A to 9C may be disposed between any one of the display panel 130 and the polarizer POL and the optical lens 110, or may be disposed on the optical lens 110.

Meanwhile, the light diffusion member 120 may take the form of a film 122 containing beads 124, as illustrated in FIGS. 6A, 7A, 8A and 9A, may have irregular convex and concave portions formed on a photo-curable resin surface, as illustrated in FIGS. 6B, 7B, 8B and 9B, or may have regular convex and concave portions formed on a photo-curable resin surface as illustrated in FIGS. 6C, 7C, 8C and 9C.

Figure 10:
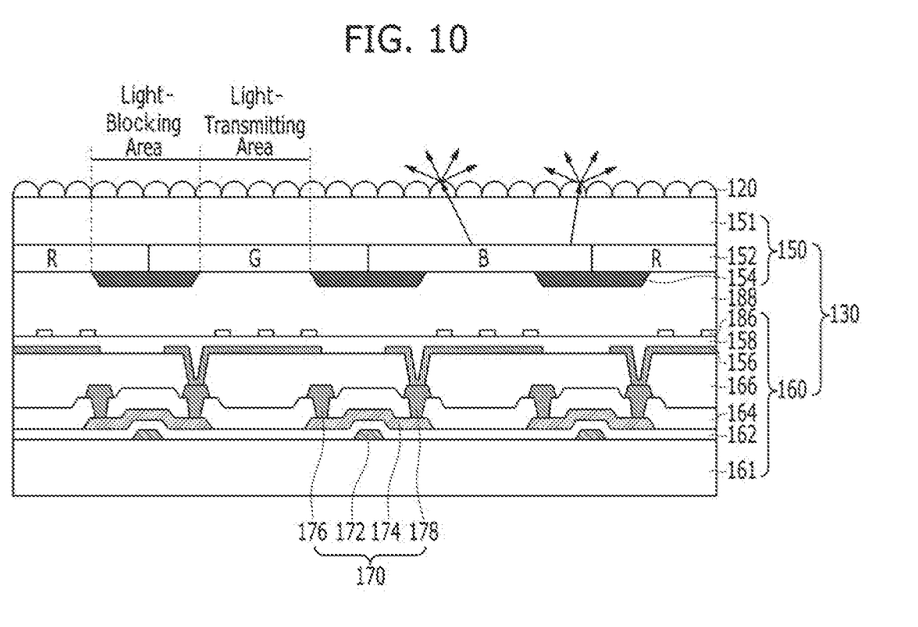
FIG. 10 is a cross-sectional view illustrating a display for virtual reality, to which a liquid crystal display panel is applied as the display panel illustrated in FIG. 2, according to an embodiment of the present invention.

FIG. 10 is a cross-sectional view illustrating a display for virtual reality in which the display panel according to the present invention is applied to a liquid crystal display panel.

In the display for virtual reality illustrated in FIG. 10, the light diffusion member 120 is disposed on the liquid crystal display panel 130, which includes a color filter array 150 and a thin-film transistor array 160, which face each other with a liquid crystal layer 188 interposed therebetween.

The thin-film transistor array 160 includes a thin-film transistor 170, a pixel electrode 156, and a common electrode 186, which are formed on a lower substrate 161.

The thin film transistor 170 supplies a data signal from a data line to the pixel electrode 156 upon receiving a gate signal from a gate line. To this end, the thin film transistor 170 includes a gate electrode 172, a semiconductor layer 174 overlapping the gate electrode 172 with a gate insulation film 162 interposed therebetween, and source and drain electrodes 176 and 178, which are formed on a first protective film 164 to come into contact with the semiconductor layer 174.

The common electrode 186 is connected to a common line, which supplies a common voltage. The common electrode 186 is formed parallel to the pixel electrode 156 and is formed alternately with the pixel electrode 156 in the case of a horizontal-field liquid-crystal display panel. The common electrode 186 is disposed on an upper substrate 151 in the case of a vertical-field liquid-crystal display panel, and has a plurality of slits in an organic protective film 158 in the case of a fringe-field liquid-crystal display panel.

The pixel-electrode 156 is formed on a second protective film 166 and is connected to the drain electrode of the thin-film transistor. The pixel-electrode 156 forms an electric field along with the common electrode 186, to which the common voltage is supplied, when a video signal is supplied to the pixel electrode 156 through the thin-film transistor 170. Thereby, liquid-crystal molecules of the liquid crystal layer 188, arranged between the color filter array 150 and the thin-film transistor array 160, are rotated by dielectric anisotropy. In addition, the transmissivity of light that passes through a light-transmitting area is changed depending on the degree of rotation of the liquid crystal molecules, which realizes gradation.

The color filter array 150 includes a black matrix 154 and color filters 152, which are stacked one above another on the upper substrate 151. The red, green, and blue color filters 152 are formed on the upper plate 151 in a light-transmitting area, which is defined by the black matrix 154, to realize corresponding colors. The black matrix 154 is formed on the light-blocking area between the respective sub-pixels to enable discrimination from the light-transmitting area of each sub-pixel, and also serves to prevent light interference and leakage between the light-transmitting areas of the adjacent sub-pixels. Meanwhile, although FIG. 10 illustrates an example in which the color filters 152 are disposed between the upper substrate 151 and the black matrix 154, the black matrix 154 may be disposed between the upper substrate 151 and the color filters 152.

The light diffusion member 120 diffuses the light that has passed through the color filter 152, which is disposed in the light-transmitting area of each sub-pixel of the liquid-crystal display panel 130, to the light-blocking area to minimize the perception of the light-blocking area by the user.

Figure 11:
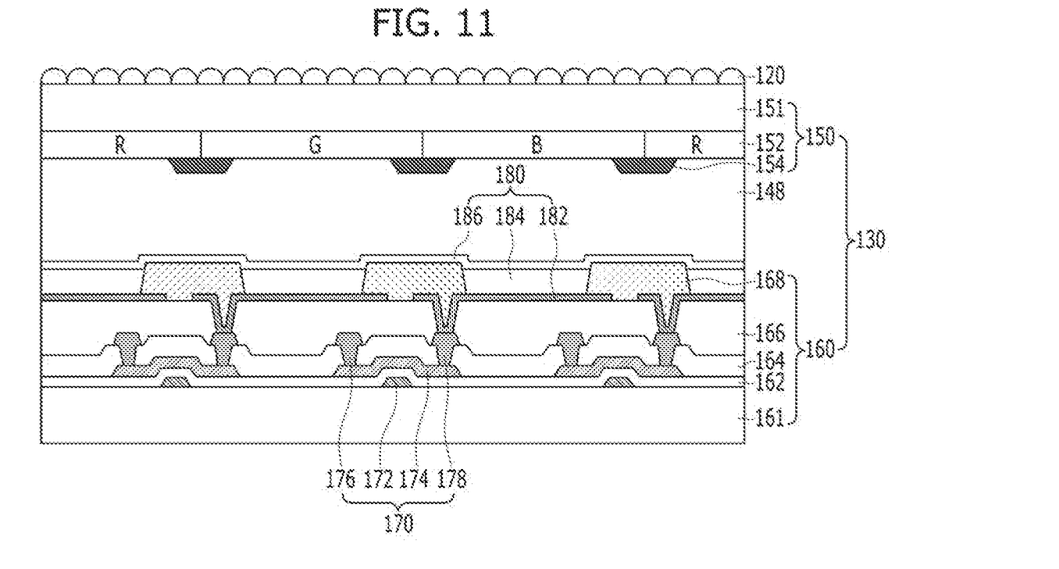
FIG. 11 is a cross-sectional view illustrating a display for virtual reality, to which an organic light-emitting display panel having a light-emitting layer for white light is applied as the display panel illustrated in FIG. 2, according to an embodiment of the present invention.

FIG. 11 is a cross-sectional view illustrating a display for virtual reality in which the display panel according to the present invention is applied to an organic light-emitting display panel having a color filter and a black matrix.

In the display for virtual reality illustrated in FIG. 11, the light diffusion member 120 is disposed on the organic light-emitting display panel 130, which includes the color filter array 150 and the thin-film transistor array 160, which are bonded to each other with an adhesive layer 148 interposed therebetween.

The color filter array 150 has the same (or similar) structure as the color filter array 150 illustrated in FIG. 10, and thus a detailed description thereof will be omitted or may be brief.

The thin-film transistor array 160 includes the thin-film transistor 170 and a light-emitting device 180, which are formed on the lower substrate 161.

The thin film transistor 170 includes the gate electrode 172, the semiconductor layer 174 overlapping the gate electrode 172 with the gate insulation film 162 interposed therebetween, and the source and drain electrodes 176 and 178, which are formed on the first protective film 164 to come into contact with the semiconductor layer 174.

The light-emitting device 180 includes an anode 182, an organic light-emitting layer 184 formed on the anode 182, and a cathode 186 formed over the organic light-emitting layer 184.

The anode 182 is electrically connected to the drain electrode 178 of the thin-film transistor 170. The organic light-emitting layer 184 is formed on the anode 182 in the light-transmitting area, which is defined by a bank 168, to overlap the color filter 152, thereby emitting white light. The organic light-emitting layer 184 is formed on the anode 182 such that a hole-associated layer, a light-emitting layer, and an electron-associated layer are stacked one above another in that sequence or in the reverse sequence thereof. The cathode 186 is formed to face the anode 182 with the organic light-emitting layer 184 interposed therebetween.

The light diffusion member 120 diffuses light emitted from the light-transmitting area of each sub-pixel of the organic light-emitting display panel 130 to the light-blocking area overlapping the black matrix 154, thereby minimizing the perception of the light-blocking area by the user. To this end, the light diffusion member 120 appropriately adjusts the haze ratio depending on at least one variable selected from among the resolution of the display panel 130, the size of the display panel 130, the pixel density (e.g., pixels per inch (PPI)), and the distance from the upper surface of the color filter 152 to the upper surface of the light diffusion member 120.

For example, the haze ratio is set to be inversely proportional to at least one of the pixel density, the aperture ratio, and the distance from the upper surface of the color filter 152 to the upper surface of the light diffusion member 120, and to be proportional to the width of the black matrix 154.

Specifically, because the lower the pixel density, the longer the distance between the sub-pixels, and consequently the wider the light-blocking area, a display panel having a relatively low pixel density is set to have a higher haze ratio of the light diffusion member 120 than a display panel having a relatively high pixel density. Because the lower the aperture ratio of the display panel, the longer the distance between the sub-pixels and the wider the light-blocking area, a display panel having a relatively low aperture ratio is set to have a higher haze ratio of the light diffusion member 120 than a display panel having a relatively high aperture ratio. Because the wider the black matrix 154 of the display panel, the longer the distance between the sub-pixels, and consequently the wider the light-blocking area, a display panel in which the black matrix 154 is relatively wide is set to have a higher haze ratio of the light diffusion member 120 than a display panel in which the black matrix 154 is relatively narrow. Because the shorter the distance from the upper surface of the color filter 152 to the upper surface of the light diffusion member 120 of the display panel, the greater the refraction angle of the light that has passed through the light diffusion member 120, a display panel in which the distance from the upper surface of the color filter 152 to the upper surface of the light diffusion member 120 is relatively short is set to have a higher haze ratio of the light diffusion member 120 than a display panel in which the distance from the upper surface of the color filter 152 to the upper surface of the light diffusion member 120 is relatively long.

Figure 12:
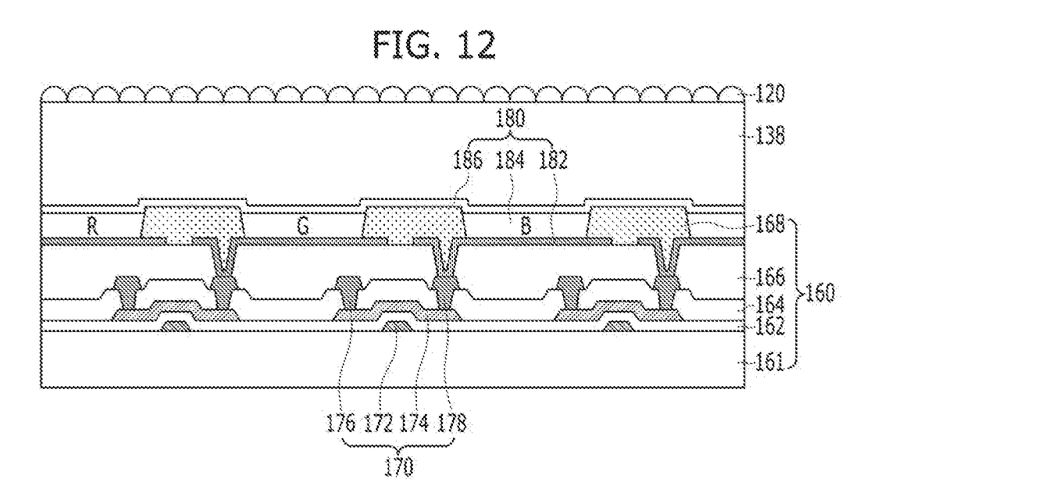
FIG. 12 is a cross-sectional view illustrating a display for virtual reality, to which an organic light-emitting display panel having a light-emitting layer for red, green, and blue light is applied as the display panel illustrated in FIG. 2, according to an embodiment of the present invention.

FIG. 12 is a cross-sectional view illustrating a display for virtual reality in which the display panel according to the present invention is applied to an organic light-emitting display panel having no color filter and no black matrix.

In the display for virtual reality illustrated in FIG. 12, the light diffusion member 120 is disposed on an encapsulation layer 138, which is formed to cover the light-emitting device 180. The light-emitting device 180 is formed in a light-emitting area provided by the black bank 168, and includes a red light-emitting device 180, a green light-emitting device 180, and a blue light-emitting device 180. The encapsulation layer 138 prevents the ingress of moisture or oxygen from the outside, thereby improving reliability.

The light diffusion member 120 diffuses light that has passed through the light-emitting layer 184 for red, green, and blue light of each sub-pixel of the organic light-emitting display panel 130 to the light-blocking area overlapping the black bank 168, thereby minimizing the perception of the light-blocking area by the user. To this end, in the case of an organic light-emitting display panel, which includes no color filter and emits light of the color of a corresponding pixel from a light-emitting layer, the light diffusion member appropriately adjusts the haze ratio depending on at least one variable selected from among the resolution of the display panel 130, the size of the display panel 130, the pixel density (e.g., pixels per inch (PPI)), and the distance from the upper surface of the organic light-emitting layer 184 to the upper surface of the light diffusion member 120.

For example, the haze ratio is set so as to be inversely proportional to at least one of the pixel density, the aperture ratio, and the distance from the upper surface of the organic light-emitting layer 184 to the upper surface of the light diffusion member 120, and to be proportional to the width of the black back 168.

Specifically, because the lower the pixel density, the longer the distance between the sub-pixels, and consequently the wider the light-blocking area, an organic light-emitting display panel having a relatively low pixel density (aperture ratio) is set to have a higher haze ratio of the light diffusion member 120 than an organic light-emitting display panel having a relatively high pixel density. Because the wider the black bank 168 of the organic light-emitting display panel, the longer the distance between the sub-pixels, and consequently the wider the light-blocking area, an organic light-emitting display panel in which the black bank 168 is relatively wide is set to have a higher haze ratio of the light diffusion member 120 than an organic light-emitting display panel in which the black bank 168 is relatively narrow. Because the shorter the distance from the upper surface of the organic light-emitting layer 184 to the upper surface of the light diffusion member 120 of the organic light-emitting display panel, the greater the refraction angle of the light that has passed through the light diffusion member 120, the organic light-emitting display panel in which the distance from the upper surface of the organic light-emitting layer 184 to the upper surface of the light diffusion member 120 is relatively short is set to have a higher haze ratio of the light diffusion member 120 than an organic light-emitting display panel in which the distance from the upper surface of the organic light-emitting layer 184 to the upper surface of the light diffusion member 120 is relatively long.

Table 1 illustrates the results of simulating alleviation of a screen-door effect by adjusting the pixel density, the aperture ratio, and the distance between the light-emitting layer and the light diffusion member.

TABLE 1

|  | No effect | Effect | Blurred Image |
| --- | --- | --- | --- |
| Panel 1 | 20% haze | 50% haze | 80% haze |
| Panel 2 | 10% haze | 40% haze | 70% haze |
| Panel 3 | 10% haze | 60% haze | 90% haze |

It can be seen that Panel 1 has a lower pixel density (ppi) than Panel 2, and shows alleviation of a screen-door effect at a haze ratio of about 50%, which is higher than that in Panel 2. It can be seen that Panel 2 has a higher aperture ratio than Panel 3, and shows alleviation of a screen-door effect at a haze ratio of about 40%, which is lower than that in Panel 3. It can be seen that Panel 3 has a shorter distance from the light-emitting layer to the light diffusion member than Panel 1, and shows alleviation of a screen-door effect at a haze ratio of about 60%, which is higher than that of Panel 1.

Although in the embodiments of the present invention, the organic light-emitting display panel and the liquid crystal panel have been described by way of example, the present invention may be applied to all other display panels having a light-blocking area.

In addition, although the embodiments of the present invention have been described only with reference to a top-emission-type organic light-emitting display panel, the present invention may also be applied to a bottom-emission-type organic light-emitting display panel or other types of organic light-emitting display panel.

As is apparent from the above description, a light diffusion member is provided between a display panel and an optical lens according to one or more embodiments of the present invention. The light diffusion member may diffuse light emitted from a light-transmitting area of each sub-pixel in the display panel to a light-blocking area, which minimizes the perception of the light-blocking area by a user, resulting in the alleviation of a screen-door effect and the improved image quality.

It will be apparent to those skilled in the art that the present invention described above is not limited to the embodiments described above and the accompanying drawings, and various substitutions, modifications, and alterations may be devised within the spirit and scope of the present invention.

What is claimed is:

1. A virtual reality display comprising:
 a display panel including a plurality of sub-pixels, and light-transmitting areas and a light-blocking area disposed between the light-transmitting areas;
 a black matrix disposed in the light-blocking area, a portion of the black matrix being disposed between two adjacent sub-pixels among the plurality of sub-pixels;
 a bank disposed between the two adjacent sub-pixels among the plurality of sub-pixels;
 a thin-film transistor electrically connected to one of the two adjacent sub-pixels;
 an optical lens configured to be disposed between the display panel and an eye of a user who views an image displayed by the display panel; and
 a light diffusion member disposed between the plurality of sub-pixels and the optical lens, and configured to diffuse light, which is emitted from each of the light-transmitting areas, to the light-blocking area,
 wherein the optical lens is configured to be disposed between the light diffusion member and the eye of the user,
 wherein the light diffusion member overlaps with the portion of the black matrix in an area between the two adjacent sub-pixels,
 wherein the bank overlaps with both the black matrix and the thin-film transistor, and the bank is disposed between the black matrix and the thin-film transistor,
 wherein the bank overlaps two anodes respectively corresponding to the two adjacent sub-pixels, and
 wherein a gate electrode of the thin-film transistor overlaps with the bank, the black matrix and the light diffusion member.

2. The virtual reality display according to claim 1, wherein the light diffusion member is formed of a resin layer having an irregular or regular convex-and-concave shape, or is formed of a resin layer containing one or more beads.

3. The virtual reality display according to claim 2, wherein the resin layer of the light diffusion member is disposed on a base film, and the base film is attached to the display panel via an adhesive.

4. The virtual reality display according to claim 2, wherein the resin layer of the light diffusion member is disposed on a polarizer on a top of the display panel, or an uppermost layer of the display panel.

5. The virtual reality display according to claim 2, wherein the resin layer of the light diffusion member is disposed on a base film, and the light diffusion member is disposed between the display panel and the optical lens.

6. The virtual reality display according to claim 1, wherein the display panel is at least one of a liquid crystal display panel and an organic light-emitting display panel, each of the liquid crystal display panel and the organic light-emitting display panel including a color filter disposed in each of the light-transmitting areas, and
 wherein the light diffusion member diffuses light that has passed through the color filter to the light-blocking area.

7. The virtual reality display according to claim 6, wherein a ratio of the light diffused to the light-blocking area to all of the light that has passed through the color filter is proportional to a width of the black matrix, and is inversely proportional to a distance from an upper surface of the color filter to an upper surface of the light diffusion member.

8. The virtual reality display according to claim 1, wherein the display panel is an organic light-emitting display panel including a light-emitting layer for red, green, and blue light disposed in each of the light-transmitting areas, and
 wherein the light diffusion member diffuses light that has passed through the light-emitting layer for red, green, and blue light to the light-blocking area.

9. The virtual reality display for according to claim 8, wherein a ratio of the light diffused to the light-blocking area to all of the light that has passed through the light-emitting layer for red, green, and blue light is inversely proportional to a distance from an upper surface of the light-emitting layer to an upper surface of the light diffusion member.

10. The virtual reality display according to claim 1, wherein the display panel is an organic light-emitting display panel including a light-emitting layer for red, green, and blue light disposed in each of the light-transmitting areas, and a black bank disposed in the light-blocking area, and
 wherein a ratio of the light diffused to the light-blocking area to all of the light that has passed through the light-emitting layer for red, green, and blue light is proportional to a width of the black bank, and is inversely proportional to a distance from an upper surface of the light-emitting layer to an upper surface of the light diffusion member.

11. The virtual reality display according to claim 1, wherein the display panel is an organic light-emitting display panel including at least one light-emitting layer for at least one of red, green, blue and white light, disposed in the light-transmitting areas.

12. The virtual reality display according to claim 1, wherein the bank fills a depression in one of the two anodes in an area overlapping with a drain electrode of the thin-film transistor.

13. A virtual reality display comprising:
 an organic light-emitting display panel including a plurality of sub-pixels, and light-transmitting areas and a light-blocking area disposed between the light-transmitting areas;
 a black matrix disposed in the light-blocking area, a portion of the black matrix being disposed between two adjacent sub-pixels among the plurality of sub-pixels;
 a bank disposed between the two adjacent sub-pixels among the plurality of sub-pixels;
 a thin-film transistor electrically connected to one of the two adjacent sub-pixels;
 an optical lens configured to be disposed between the organic light-emitting display panel and an eye of a user who views an image displayed by the organic light-emitting display panel; and
 a light diffusion member disposed between the organic light-emitting display panel and the optical lens, and configured to diffuse light, which is emitted from each of the light-transmitting areas, to the light-blocking area,
 wherein the optical lens is configured to be disposed between the light diffusion member and the eye of the user,
 wherein the light diffusion member overlaps with the portion of the black matrix in an area between the two adjacent sub-pixels,
 wherein the bank overlaps with both the black matrix and the thin-film transistor, and the bank is disposed between the black matrix and the thin-film transistor,
 wherein the bank overlaps two anodes respectively corresponding to the two adjacent sub-pixels, and wherein a gate electrode of the thin-film transistor overlaps with the bank, the black matrix and the light diffusion member.

14. The virtual reality display according to claim 13, wherein the organic light-emitting display panel includes:
   a color filter disposed in each of the light-transmitting areas; and
   a light-emitting layer for white light disposed to overlap the color filter,
   wherein the light-diffusion member diffuses light that has passed through the color filter to the light-blocking area.

15. The virtual reality display according to claim 14, wherein a ratio of the light diffused to the light-blocking area to all of the light that has passed through the color filter is proportional to a width of the black matrix, and is inversely proportional to a distance from an upper surface of the color filter to an upper surface of the light diffusion member.

16. The virtual reality display according to claim 13, wherein the organic light-emitting display panel includes a light-emitting layer for red, green, and blue light disposed in each of the light-transmitting areas, and
   wherein the light diffusion member diffuses light that has passed through the light-emitting layer for red, green, and blue light to the light-blocking area.

17. The virtual reality display according to claim 16, wherein a ratio of the light diffused to the light-blocking area to all of the light that has passed through the light-emitting layer for red, green, and blue light is inversely proportional to a distance from an upper surface of the light-emitting layer to an upper surface of the light diffusion member.

18. The virtual reality display according to claim 13, wherein the organic light-emitting display panel includes:
   a light-emitting layer for red, green, and blue light disposed in each of the light-transmitting areas; and
   a black bank disposed in the light-blocking area, and
   wherein a ratio of the light diffused to the light-blocking area to all of the light that has passed through the light-emitting layer for red, green, and blue light is proportional to a width of the black bank, and is inversely proportional to a distance from an upper surface of the light-emitting layer to an upper surface of the light diffusion member.

19. The virtual reality display according to claim 13, wherein the bank fills a depression in one of the two anodes in an area overlapping with a drain electrode of the thin-film transistor.

* * * * *